United States Patent
Ando

(10) Patent No.: US 6,475,862 B1
(45) Date of Patent: Nov. 5, 2002

(54) SEMICONDUCTOR DEVICE HAVING GATE INSULATING LAYERS DIFFERENT IN THICKNESS AND MATERIAL AND PROCESS FOR FABRICATION THEREOF

(75) Inventor: Koichi Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/636,078

(22) Filed: Aug. 10, 2000

(30) Foreign Application Priority Data

Aug. 13, 1999 (JP) .......................................... 11-229351

(51) Int. Cl.[7] ........................................... H01L 21/336
(52) U.S. Cl. ....................... 438/264; 438/769; 438/775; 438/275; 438/770
(58) Field of Search ................................ 438/770, 769, 438/775, 786, 787, 275, 264

(56) References Cited

U.S. PATENT DOCUMENTS

| | | | | |
|---|---|---|---|---|
| 5,254,789 A | * | 10/1993 | Nakata | 438/258 |
| 5,502,009 A | * | 3/1996 | Lin | 438/275 |
| 5,591,681 A | * | 1/1997 | Wristers et al. | 438/264 |
| 5,723,355 A | * | 3/1998 | Chang et al. | 438/275 |
| 6,093,661 A | * | 7/2000 | Trivedi et al. | 438/769 |
| 6,165,846 A | * | 12/2000 | Carns et al. | 438/264 |
| 6,225,167 B1 | * | 5/2001 | Yu et al. | 438/275 |
| 6,258,673 B1 | * | 7/2001 | Houlihan et al. | 438/275 |
| 6,268,296 B1 | * | 7/2001 | Misium et al. | 438/763 |
| 6,300,197 B1 | * | 10/2001 | Inaba | 438/264 |
| 6,391,701 B1 | * | 2/2002 | Inoue | 438/225 |
| 6,383,861 B1 | * | 5/2002 | Gonzalez et al. | 438/241 |

FOREIGN PATENT DOCUMENTS

| | | | | |
|---|---|---|---|---|
| JP | 04-154162 | * | 5/1992 | ......... H01L/29/784 |
| JP | 04-208570 | * | 7/1992 | ......... H01L/29/784 |
| JP | 2000-003965 | * | 6/1998 | ....... H01L/21/8234 |
| JP | 10-335656 | | 12/1998 | |

OTHER PUBLICATIONS

M. Bhat et al., MOS Characteristic of Ultrathin NO–Grown Oxynitride, IEEE 1994, pp. 421–423.*
C.T. Liu et al., Multiple Gate Oxide Thickness for 2GHz System–on–A–Chip Technologies, IEEE 1998, pp. 589–592.*
C.H. Lee et al., A Manufacturable Multiple Gate Oxynitride Thickness Technology for System On A Chip, IEEE 1999, pp. 491–494.*
M. Bhat et al., Recent Developments in N2O and NO–Based Oxynitride Dielectrics for CMOS ULSI Applications, EDMS 1994, pp. 111–114.*
L.K. Han et al., Highly Suppressed Boron Penetration in NO–Nitrided SiO2 for p+ Polysilicon Gated MOS Device Applications. IEEE 1995, pp. 319–321.*

* cited by examiner

Primary Examiner—Olik Chaudhuri
Assistant Examiner—Anh Duy Mai

(57) ABSTRACT

Field effect transistors of an integrated circuit are fabricated on a silicon substrate, and require gate insulating layers appropriate for the purpose of individual component circuits, the active areas assigned the field effect transistors are sequentially exposed to source gas varied in the ratio between oxygen and nitrogen for growing silicon oxide and/or silicon oxynitride thereon, and the nitrogen serves as a diffusion inhibitor against the oxygen so as to form the gate insulating layers different in thickness of the order of several angstroms.

11 Claims, 14 Drawing Sheets

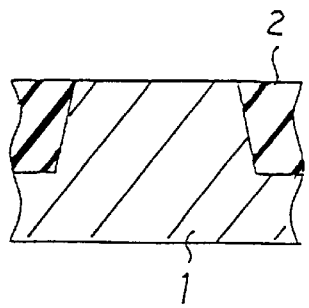
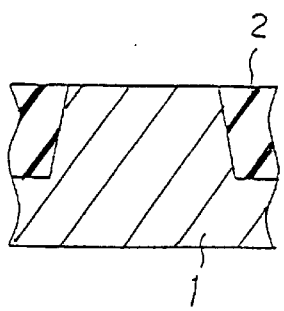
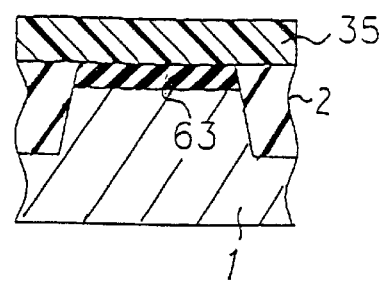
Fig. 2D
PRIOR ART
Fig. 3D
PRIOR ART
Fig. 4D
PRIOR ART
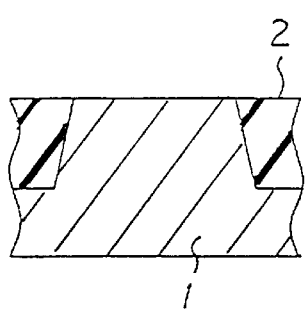
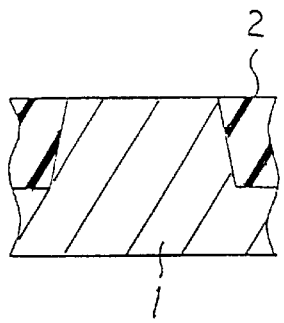
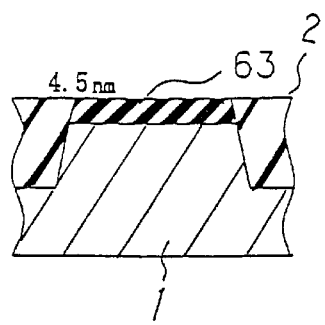
Fig. 2E
PRIOR ART
Fig. 3E
PRIOR ART
Fig. 4E
PRIOR ART
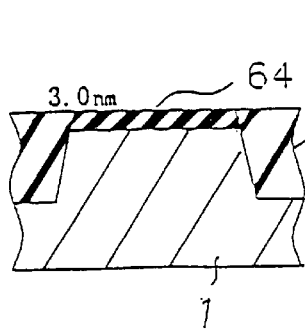
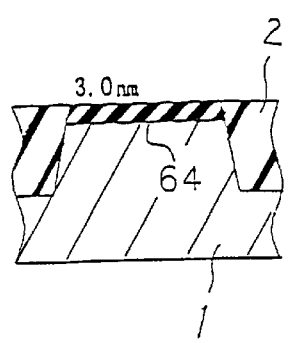
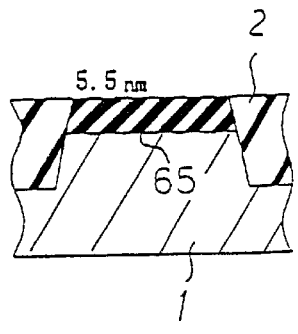
Fig. 2F
PRIOR ART
Fig. 3F
PRIOR ART
Fig. 4F
PRIOR ART

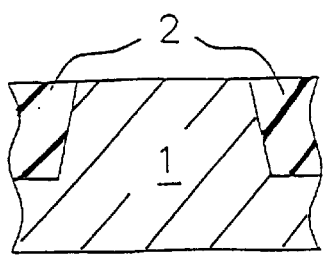
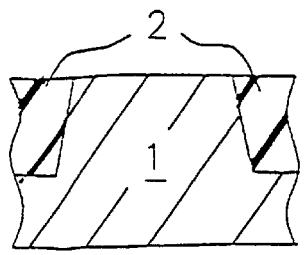
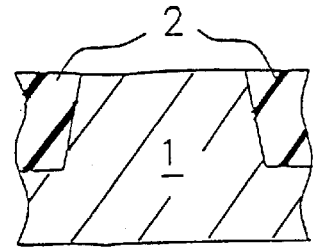
Fig. 5A    Fig. 6A    Fig. 7A
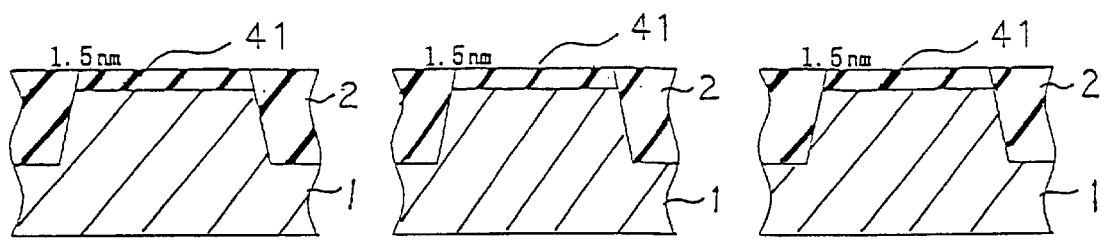
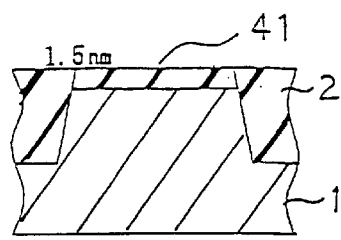
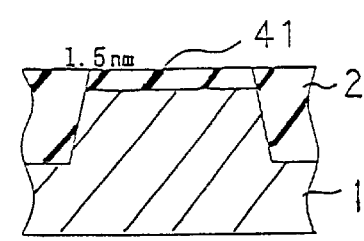
Fig. 5B    Fig. 6B    Fig. 7B
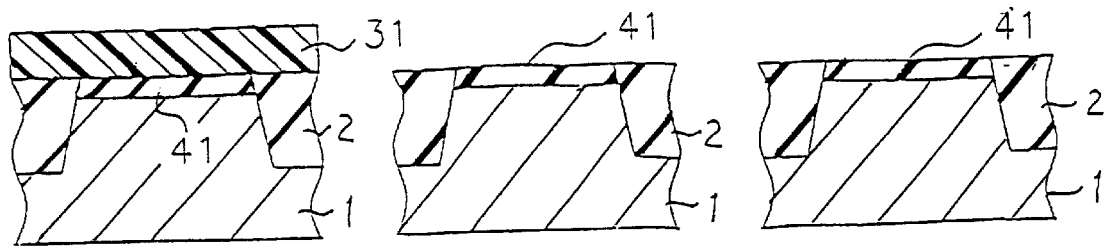
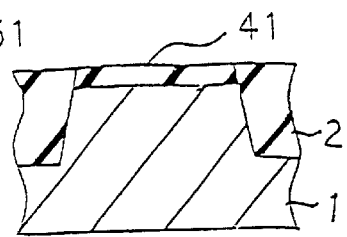
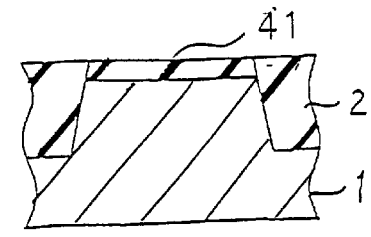
Fig. 5C    Fig. 6C    Fig. 7C

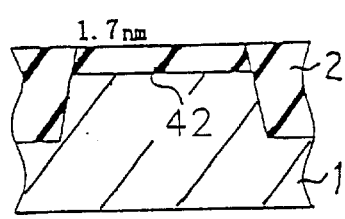
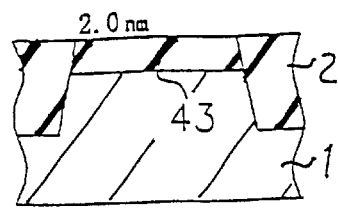
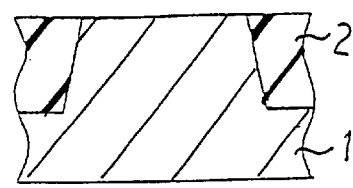
Fig. 5I     Fig. 6I     Fig. 7I
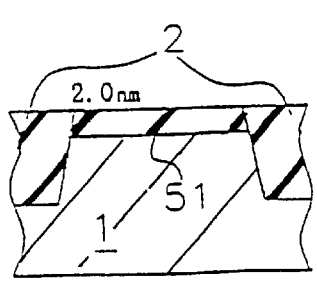
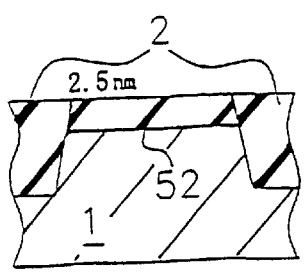
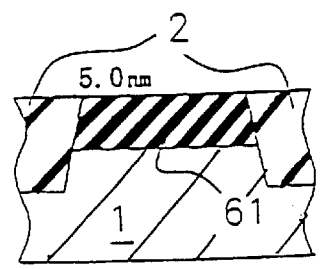
Fig. 5J     Fig. 6J     Fig. 7J

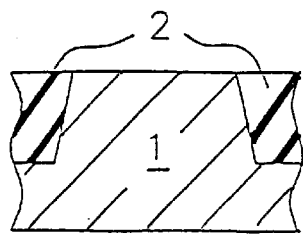
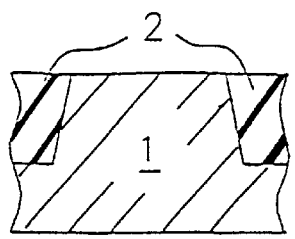
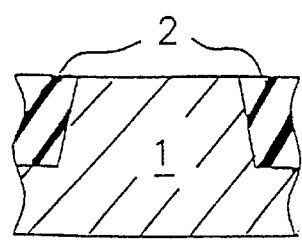
Fig. 8A     Fig. 9A     Fig. 10A
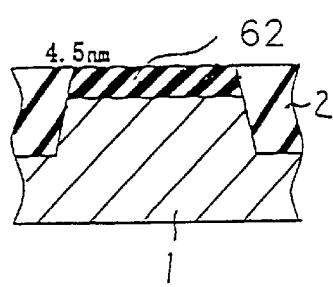
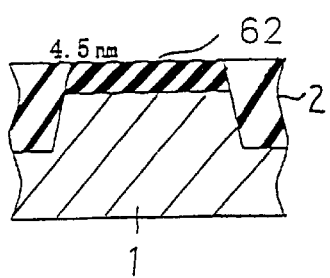
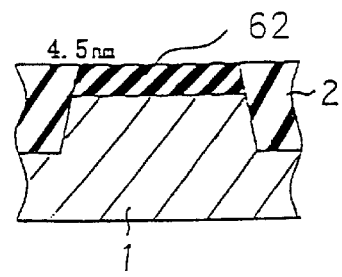
Fig. 8B     Fig. 9B     Fig. 10B
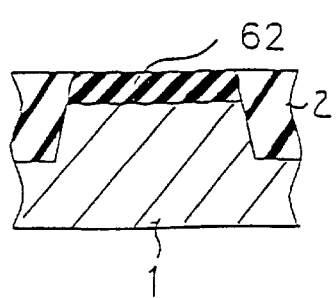
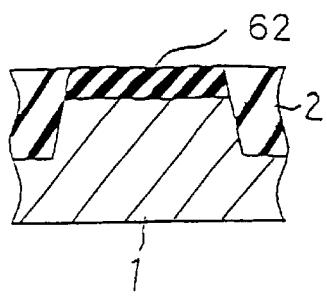
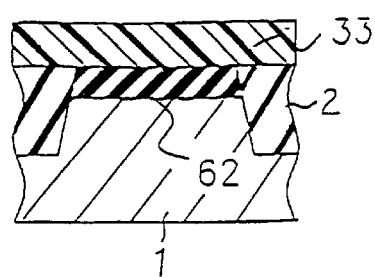
Fig. 8C     Fig. 9C     Fig. 10C

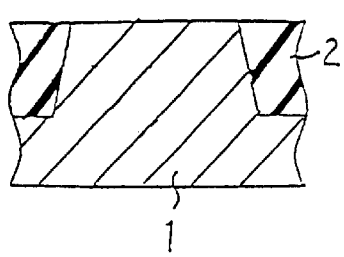
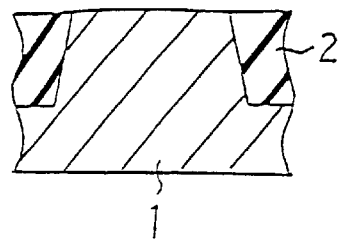
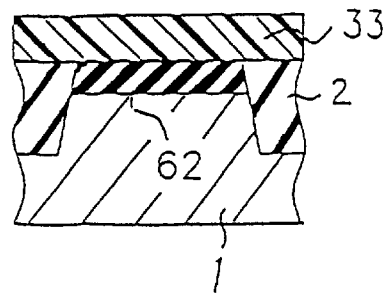
Fig. 8D    Fig. 9D    Fig. 10D
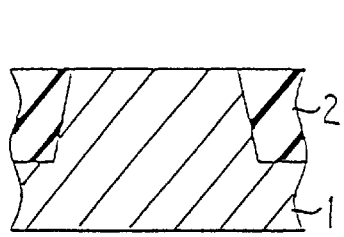
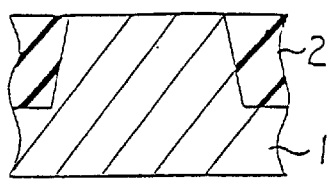
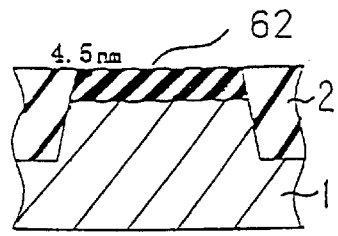
Fig. 8E    Fig. 9E    Fig. 10E
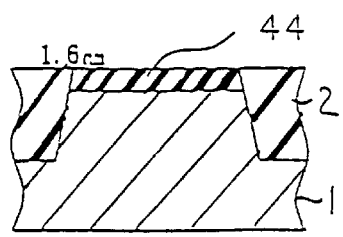
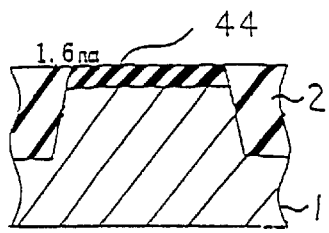
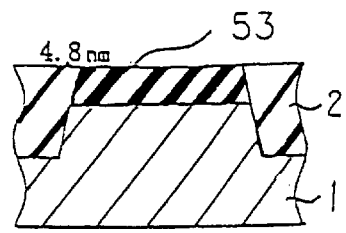
Fig. 8F    Fig. 9F    Fig. 10F

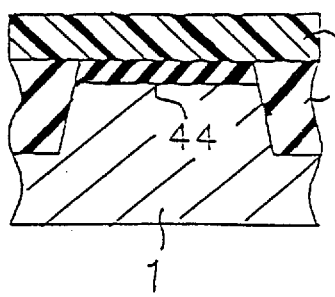 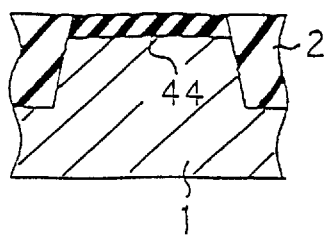 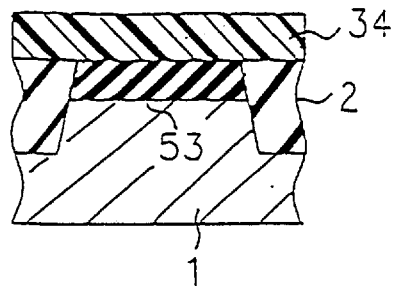
Fig. 8G　　　Fig. 9G　　　Fig. 10G
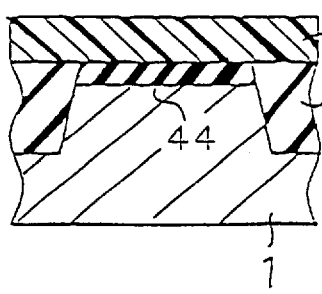 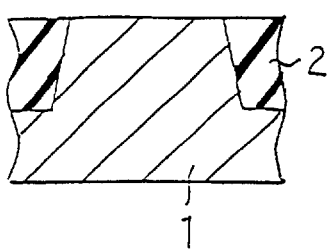 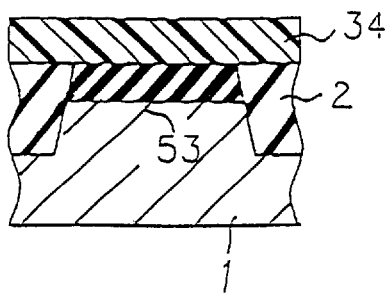
Fig. 8H　　　Fig. 9H　　　Fig. 10H

SEMICONDUCTOR DEVICE HAVING GATE INSULATING LAYERS DIFFERENT IN THICKNESS AND MATERIAL AND PROCESS FOR FABRICATION THEREOF

FIELD OF THE INVENTION

This invention relates to a semiconductor integrated circuit device and, more particularly, to a semiconductor integrated circuit device with MIS (Metal-Insulator-Semiconductor) field effect transistors and process for fabricating the semiconductor integrated circuit device.

DESCRIPTION OF THE RELATED ART

Plural circuit elements are integrated on a semiconductor substrate, and are selectively connected for forming an integrated circuit. The integrated circuit is broken down into a signal interface and a functional circuit. Signals are transferred between the functional circuit and the outside thereof through the signal interface. The functional circuit processes signals carried with pieces of data information, and temporarily stores the result of the data processing.

The data processing is assigned to an arithmetic and logic circuit, and a memory circuit stores the results. Typical examples of the memory circuit are a dynamic random access memory and a static random access memory, and the arithmetic and logic circuit is, by way of example, implemented by CMOS (Complementary Metal Oxide Semiconductor) logic gates. MOS (Metal Oxide Semiconductor) field effect transistors are, by way of example, used for the signal interface. Thus, field effect transistors are major circuit components of the integrated circuit.

One of the goals in the technical field is to operate the field effect transistors at high speed under low power voltage. A field effect transistor with a thin gate insulating layer is suitable for the technical goal. The miniaturization, high-speed and low power consumption are still required for the semiconductor integrated circuit device. The functional circuit are formed by using the component field effect transistors, the gate insulating layers of which get thinner and thinner for operating under the low power voltage. However, the solution is less employable in the signal interface. The external signals are applied to the signal interface, and the voltage range of the external signals is independent of the internal power supply system in the integrated circuit. Thus, the external signal is a dominating factor in the signal interface. In this situation, the component field effect transistors of the signal interface are designed separately from those of the functional circuit, and the gate insulating layers thereof are usually thicker than those of the component field effect transistors of the functional circuit. In a semiconductor integrated circuit device commercially obtainable, the component field effect transistors of the signal interface are designed to have the gate insulating layers of 7 nanometers thick, and the component field effect transistors of the functional circuit are designed to have the gate insulating layers of 4 nanometers thick.

The design and research efforts are been made for the field effect transistors with the emphasis put on faster transistors. The speed-up is not constantly required over the integrated circuit. The speed-up is more important to the arithmetic and logic circuit than another part of the integrated circuit. The gate insulating layer is going to reduce from 7 nanometers thick to 5 nanometers thick for the circuit components of the signal interface and from 4 nanometers thick to 2 nanometers thick for the functional circuit.

The thin gate insulating layers surely accelerate the switching actions of the component field effect transistors. However, a problem is encountered in the component field effect transistors in the leakage current flowing through the thin gate insulating layers. FIG. 1 illustrates the leakage current density in terms of the thickness Tox of the gate insulating layer formed of silicon oxide. The axis of abscissas is indicative of the thickness of the gate insulating layer formed of silicon oxide. On the other hand, the axis of coordinates is indicative of the leakage current density. When the gate insulating layer is biased with 1.5 volts, the leakage current density is varied in inversely exponentially proportional to the thickness of the gate insulating layer. Thus, the thin gate insulating layers give rise to increase of the leakage current flowing therethrough.

The leakage current is undesirable for the integrated circuit. First, the power consumption is increased in the idling state. Second, the thin gate insulating layers are damaged or deteriorated due to the leakage current. Third, a piece of data information is destroyed when the field effect transistors form a memory cell. This means that the leakage current sets a limit to the thickness of the gate insulating layer. The limit is varied depending upon the operating environment of the field effect transistor such as, for example, the bias voltage and function of the associated circuitry.

As will be understood, an integrated circuit includes field effect transistors different in thickness, and the difference in thickness is dependent on the requirements for a circuitry. Although the manufacturer makes the gate insulating layers different in thickness between the component field effect transistors of the signal interface and the field effect transistors of the functional circuit both integrated on a semiconductor substrate, the difference in thickness is of the order of 3 nanometers thick. It is said that the limit to the gate insulating layers is 3 nanometers to 1 nanometer. Even if the manufacturer designs field effect transistors of an integrated circuit to have the gate insulating layers different in thickness of the order of 0.5 nanometer, the integrated circuit is not feasible. For example, a manufacturer is assumed to design field effect transistors with the gate insulating layers of 2.0 nanometers thick for the arithmetic and logic circuit and field effect transistors with the gate insulating layers of 2.5 nanometers thick for the memory circuit. The manufacturer fabricates the two kinds of field effect transistors different in thickness on a semiconductor substrate through the prior art process. However, the gate insulating layers are not properly fallen within the range around 2.0 nanometers thick and the range around 2.5 nanometers thick upon completion of the fabrication process. The gate insulating layers are randomly fallen within the range around 2.0 nanometers thick and the range around 2.5 nanometers thick, and it is impossible to discriminate the design intention from the field effect transistors fabricated on the semiconductor substrate. Thus, the difference of 1 nanometer thick is the limit to the gate insulating layers of the order of 4 nanometers thick or less in so far as the field effect transistors are fabricated through known process sequences.

Description is hereinbelow made on the prior art process sequences. The first prior art process is used for a semiconductor integrated circuit device having three regions assigned to different circuits. The first region is referred to as a core region, and a CMOS logic circuit is assigned to the core region. The second region is referred to as an SRAM (Static Random Access Memory) region, and the SRAM region is assigned to a static random access memory. The component field effect transistors of the CMOS logic circuit are different in thickness of the gate insulating layers from the component field effect transistors of the static random access memory. The third region is referred to as a peripheral region, and an input-and- output circuit is assigned to the peripheral region. The component field effect transistors of the input-and-output circuit are different in thickness of the gate insulating layers from those of the CMOS logic circuit and those of the static random access memory.

FIGS. 2A to 2J, 3A to 3J and 4A to 4J illustrate the first prior art process for fabricating the semiconductor integrated circuit device. FIGS. 2A to 2J show a cross section of the core region, and a gate insulating layer is adapted to 1.8 nanometers thick. FIGS. 3A to 3J show a cross section of the SRAM region, and a gate insulating layer is adapted to 4.0 nanometers thick. FIGS. 4A to 4J show a cross section of the peripheral region, and a gate insulating layer is adapted to 6.0 nanometers thick. The cross sections in FIGS. 2A, 3A and 4A are achieved at the end of the first step of the first prior art process, and FIGS. 2B, 3B and 4B show the cross sections at the end of the second step. Similarly, FIGS. 2C/3C/4C, 2D/3D/4D, 2E/3E/4E, . . . 2J/3J/4J shows the cross sections at the end of the third step, the end of the fourth step, the end of the fifth step, . . . and the end of the tenth step, respectively.

The first prior art process starts with preparation of a silicon substrate 1. A trench isolating region 2 are formed in a surface portion of the silicon substrate 1, and defines active areas in the three regions. There is not any difference between the cross sections. The resultant structure is shown in FIGS. 2A, 3A and 4A.

Subsequently, the semiconductor substrate 1 is placed in a furnace chamber (not shown), and oxidation atmosphere is created in the furnace chamber. Oxygen is 100 percent in the oxidation atmosphere. The silicon substrate 1 is exposed to the oxidation atmosphere for 30 minutes. Then, silicon oxide layers 63 are thermally grown to 4.5 nanometers thick in the active areas as shown in FIGS. 2B, 3B and 4B.

Subsequently, photo-resist solution is spread over the entire surface of the resultant structure, and is baked so as to form a photo-resist layer. A pattern image is transferred to the photo-resist layer, and forms a latent image in the photo-resist layer. The latent image is developed, and a photo-resist mask 35 is formed from the photo-resist layer. Thus, the photo-resist mask 35 is patterned through the photo-lithography, and only the active area in the peripheral region is covered with the photo-resist mask as shown in FIGS. 2C, 3C and 4C.

The resultant structure is subjected to an etching. The photo-resist mask 35 prevents the silicon oxide layer 63 in the peripheral region from the etchant. However, the silicon oxide layers 63 in the core region and the SRAM region are etched away. The silicon is exposed to the active area in the core region and the active area in the SRAM region, again. The resultant structure is shown in FIGS. 2D, 3D and 4D.

Subsequently, the photo-resist mask 35 is stripped off, and the silicon oxide layer 63 is exposed to the active area in the peripheral region (see FIGS. 2E, 3E and 4E). The resultant structure is oxidized, again. The oxidizing atmosphere is created by using the oxygen at 100 percent, and the silicon substrate 1 is thermally oxidized at 800 degrees in centigrade for 15 minutes. Then, silicon oxide layers 64 are grown to 3.0 nanometers thick on the active area in the core region and on the active area in the SRAM region (see FIGS. 2F and 3F), and the silicon oxide layer 63 in the peripheral region is increased in thickness to 5.5 nanometers thick. The active area in the peripheral region has been already covered with the silicon oxide layer 63, and the oxygen is diffused through the silicon oxide layer 63 until the boundary between the silicon and the silicon oxide. This means that the silicon substrate is less oxidized in the peripheral region rather than the core/SRAM regions. Thus, the growth rate of silicon oxide is lowered when the silicon oxide is increased in thickness. This is the reason why the increment of the silicon oxide layer 63 is less than the thickness of the silicon oxide layers 64. The silicon oxide layer in the peripheral region is labeled with reference numeral 65 as shown in FIG. 4F.

Subsequently, a photo-resist mask 36 is patterned on the resultant structure by using the photo-lithography, and the active area in the SRAM region and the active area in the peripheral region are covered with the photo-resist mask 36 as shown in FIGS. 2G, 3G and 4G.

The resultant structure is subjected to the etching. Although the photo-resist mask 36 prevents the silicon oxide layers 64/65 in the SRAM/peripheral regions from the etchant, the silicon oxide layer 64 is etched away from the core region, and the silicon is exposed to the active area in the core region, again. The resultant structure is shown in FIGS. 2H, 3H and 4H.

The photo-resist mask 36 is stripped off. The silicon oxide layers 64 and 65 are exposed to the active areas in the SRAM/peripheral regions, and the silicon is exposed to the active area in the core region (see FIGS. 2I, 3I and 4I).

The resultant structure is placed in the furnace chamber, again. Oxi-nitriding atmosphere is created by using oxygen at 50 percent and nitrogen monoxide (NO) at 50 percent, and the thermal oxi-nitrization is carried out in the oxi-nitriding atmosphere at 1000 degrees in centigrade for 30 to 60 seconds. Then, nitrogen-containing silicon oxide or silicon oxynitride is thermally grown on the active areas in the three regions. The silicon oxynitride is different from a silicon oxide layer and a silicon nitride layer laminated on each other. A gate insulating layer 47 of silicon oxynitride is grown to 1.8 nanometers thick on the active area in the core region (see FIG. 2J). Further, the silicon oxynitride is grown to 1 nanometer thick and 0.5 nanometer thick in the boundary between the silicon and the silicon oxide in the SRAM/peripheral regions, respectively, and the active areas in the SRAM/peripheral regions are respectively covered with gate insulating layers 55 and 56. The gate insulating layer 55 is 4.0 nanometers thick, and the gate insulating layer 56 is 6.0 nanometers thick (see FIGS. 3J and 4J).

Thus, the gate insulating layer 55 is thicker than the gate insulating layer 47 by 2.2 nanometers. Thus, the gate insulating layers 47/55/56 are different in thickness through the first prior art process, and the difference is 2.0 to 2.2 nanometers. Thus, the manufacturer merely achieves the difference ranging from 1 nanometer thick to 2 nanometers thick through the first prior art process. In other words, it is impossible to make a gate insulating layer in the SRAM region differ from a gate insulating layer in the core region by 0.5 nanometer thick.

It is said that manufacturers grow thin films different in thickness by 1–2 nanometers thick by using the current thin film growing technologies such as the thermal oxidation. Assuming now that silicon oxide layers are grown through the thermal oxidation, the manufacturer expects the thermal oxidation process to achieve the thickness 1–2 nanometers different from each other by controlling the conditions of the thermal oxidation. When silicon oxide is grown at the boundary between silicon and silicon oxide, the silicon layer decelerated the growth rate. If the silicon oxide layer to be grown on the silicon layer is relatively thick, the oxidation is continued for a relatively long time, and the difference between the silicon oxide layers is decreased from the initial value. However, the silicon oxide layer to be grown on the silicon layer is relatively thin, the oxidation is completed within a short time, and the decrement from the initial difference is negligible. In other words, the manufacturer can not rely on the deceleration of the growth as long as the silicon oxide layers are thin. Thus, the thin film growth technologies still sets the limit to the difference in thickness between the gate insulating layers formed through the first prior art process.

The second prior art process is disclosed in Japanese Patent Publication of Unexamined Application No. 10-335656. The second prior art process is featured by the step of introducing impurity into a semiconductor substrate. The growth rate of silicon oxide is varied by the impurity introduced into the silicon substrate. The second prior art process aims at reducing the photo-lithographic steps and decreasing the stress due to the heat treatment for the gate insulating layers. This means that the second prior art process did not aim at the difference less than 1 nanometer thick between ultra thin gate insulating layers of the order of 4.0 nanometers. Nevertheless, if gate insulating layers are differently grown on a semiconductor substrate through the second prior art process, the difference between the gate insulating layers would be less than that between the gate insulating layers grown through the first prior art process, because the relatively thin gate insulating layer and the relatively thick gate insulating layer are concurrently grown after the selective ion-implantation. However, a problem is encountered in the second prior art process in that the crystal structure of the semiconductor substrate is liable to be damaged due to the ion-implanted impurity such as argon, xenon, oxygen or nitrogen.

SUMMARY OF THE INVENTION

It is therefore an important object of the present invention to provide a semiconductor device, which includes gate insulating layers of field effect transistors of the order of 4 nanometers thick or less and different from one another by 1 nanometer thick or less.

It is also an important object of the present invention to provide a process for fabricating the field effect transistors on a semiconductor substrate.

To accomplish the object, the present invention proposes to use insulating material containing an oxidizing agent and a diffusion inhibitor.

In accordance with one aspect of the present invention, there is provided a semiconductor device fabricated on a semiconductor substrate comprising an integrated circuit including plural circuit components respectively having insulating layers formed of different kinds of dielectric material and different in thickness, the insulating layers of two of the plural circuit components are less than 4 nanometers thick, and the difference in thickness between the insulating layers of the two of the plural circuit components is less than 1 nanometer.

In accordance with another aspect of the present invention, there is provided a process for fabricating a semiconductor device, comprising the steps of a) preparing a substrate formed of semiconductor material and having plural portions selectively assigned to plural circuit components of an integrated circuit, b) growing a first insulating layer formed of a first kind of insulating material containing an oxidizing agent diffused therethrough and reactive with the semiconductor material and a diffusion inhibitor against the diffusion of the oxidizing agent on one of the plural portions of the substrate, c) growing a second insulating layer formed of a second kind of insulating material containing the oxidizing agent on the one of the plural portions and another portion of the substrate so as to form a first dielectric layer having at least the first and second insulating layers and a second dielectric layer different in thickness from the second insulating layer and having the second insulating layer for one of the plural circuit components and another of the plural circuit components, respectively, and d) completing the plural circuit components.

BRIEF DESCRIPTION OF THE DRAWINGS

The features and advantages of the semiconductor device and the process for fabrication thereof will be more clearly understood from the following description taken in conjunction with the accompanying drawings in which:

FIGS. 2A to 2J are cross sectional views showing the cross sections of the core region varied through the prior art process;

FIGS. 3A to 3J are cross sectional views showing the cross sections of the SRAM region varied through the prior art process;

FIGS. 4A to 4J are cross sectional views showing the cross sections of the peripheral region varied through the prior art process;

FIGS. 5A to 5K are cross sectional views showing the cross sections of a core region varied through a process according to the present invention;

FIGS. 6A to 6K are cross sectional views showing the cross sections of an SRAM region varied through the process according to the present invention;

FIGS. 7A to 7K are cross sectional views showing the cross sections of a peripheral region varied through the process according to the present invention;

FIGS. 8A to 8J are cross sectional views showing the cross sections of a core region varied through another process according to the present invention;

FIGS. 9A to 9J are cross sectional views showing the cross sections of an SRAM region varied through the process according to the present invention; and FIGS. 10A to 10J are cross sectional views showing the cross sections of a peripheral region varied through the process according to the present invention.

DESCRIPTION OF THE PREFERRED EMBODIMENTS

Thin Film Growth Technology

Figure 1:
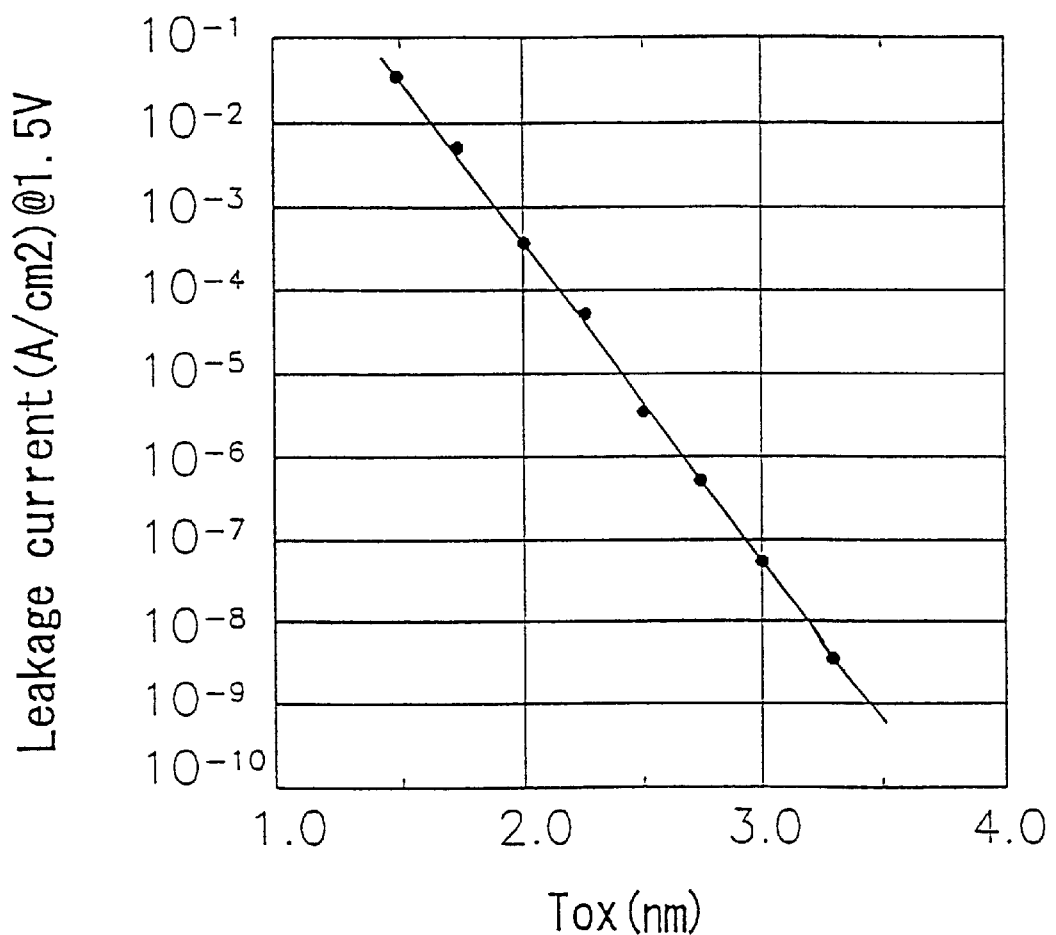
FIG. 1 is a graph showing the relation between the thickness of the gate insulating layer and the leakage current density.
Figure 2A:
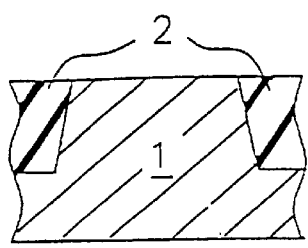
Figure 3A:
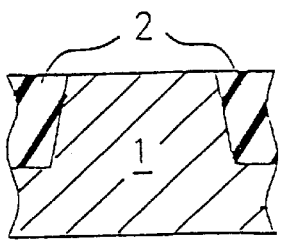
Figure 4A:
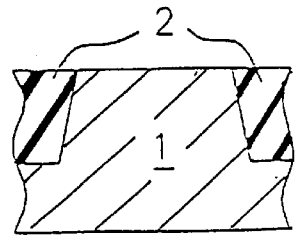
Figure 2B:
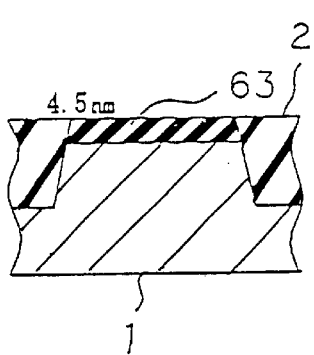
Figure 3B:
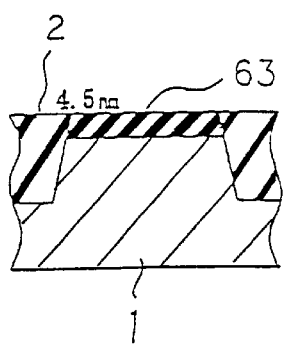
Figure 4B:
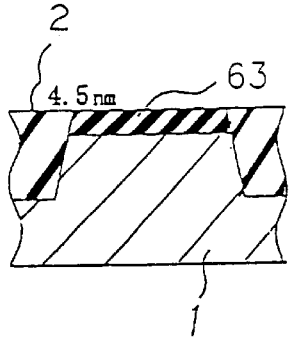
Figure 2C:
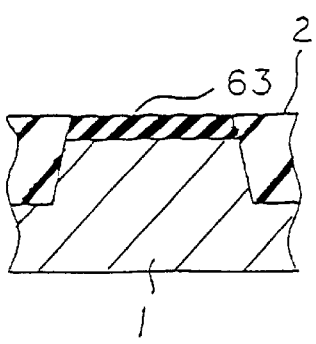
Figure 3C:
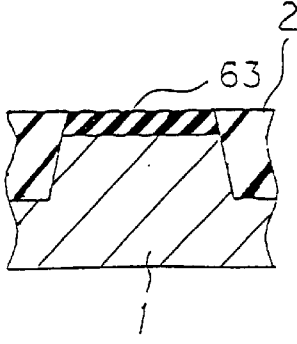
Figure 4C:
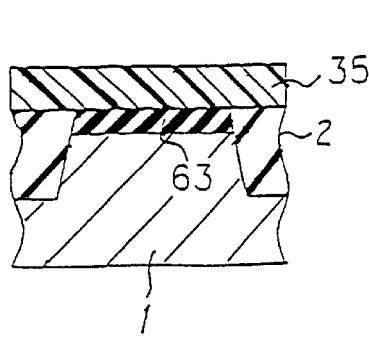
Figure 2G:
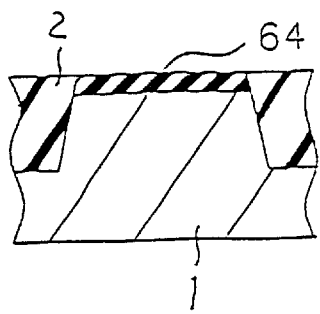
Figure 3G:
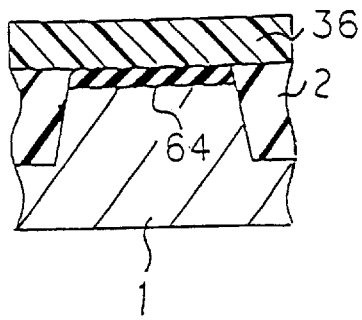
Figure 4G:
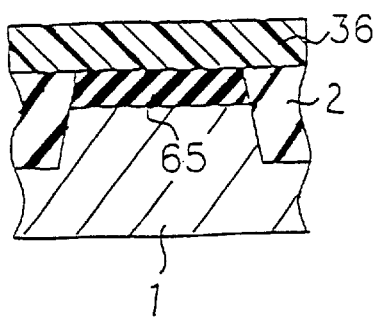
Figure 2H:
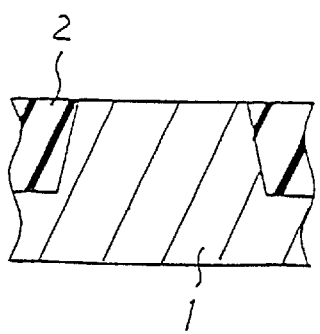
Figure 3H:
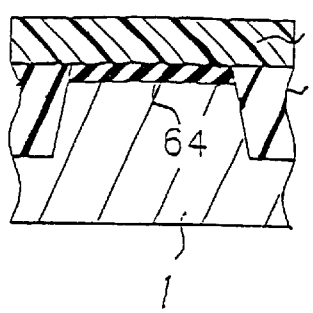
Figure 4H:
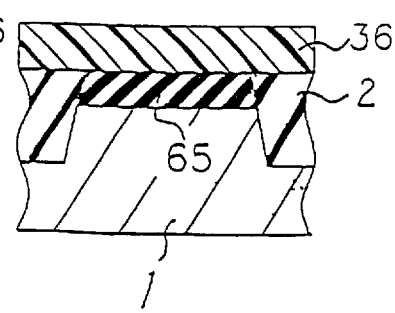
Figure 2I:
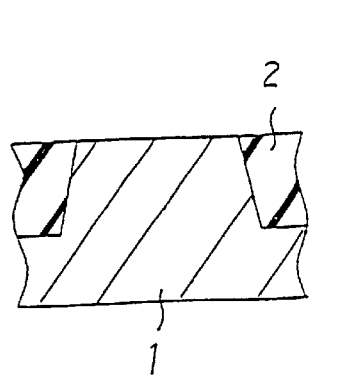
Figure 3I:
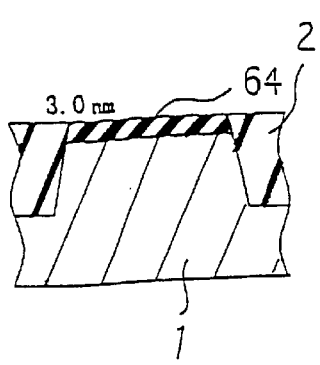
Figure 4I:
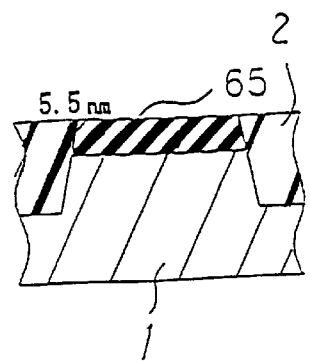
Figure 2J:
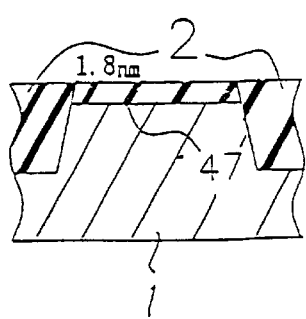
Figure 3J:
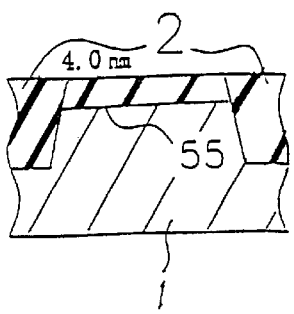
Figure 4J:
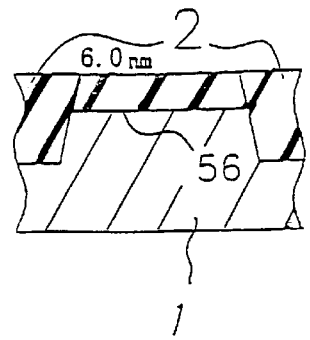

A thin film growth technology used in a process according to the present invention is firstly described hereinbelow. The thin film growth technology is referred to as "oxi-nitrization techniques", and is used for growing gate insulating layers. Silicon oxynitride is grown through the oxi-nitrization, and the nitrogen content of the silicon oxynitride is varied as described hereinbelow.

If the atmosphere is created with nitrogen monoxide (NO) at 100 percent, the reaction is dominated by nitrization. A silicon substrate is usually exposed to the nitrogen monoxide at 1000 degrees to 1100 degrees in centigrade for strongly nitrizing a surface portion thereof.

When the atmosphere is created with gaseous mixture between nitrogen monoxide and oxygen ($O_2$), the reaction is dominated by either nitrization or oxidization depending upon the mixing ratio between the nitrogen monoxide and the oxygen. A silicon substrate is usually exposed to the gaseous mixture at 1000 degrees to 1100 degrees in centigrade for strongly or weakly nitrizing a surface portion thereof.

When the atmosphere is created with oxygen at 1000 degrees in centigrade for a first time period and, thereafter, with the nitrogen monoxide at 1000 degrees to 1100 degrees in centigrade for a second time period, the nitrogen content in the silicon oxynitride is varied with the ratio between the first time period and the second time period.

When the atmosphere is created with nitrogen monoxide at 500 degrees to 1000 degrees in centigrade for a first time period and, therafter, with oxygen at 1000 degrees to 1100 degrees in centigrade for a second time period, the nitrogen content in the silicon oxynitride is dependent on the ratio between the first time period and the second time period.

When the atmosphere is created with gaseous mixture between nitrogen monoxide and oxygen at 700 degrees to 1000 degrees in centigrade for a first time period and, thereafter, with oxygen at 1000 degrees to 1100 degrees in centigrade for a second time period, the nitrogen content in the silicon oxynitride is varied with both of the mixing ratio between the nitrogen monoxide and the oxygen and the ratio between the first time period and the second time period.

The above-described oxi-nitrization techniques are selectively used in the process according to the present invention.

First Embodiment

A process embodying the present invention is hereinbelow described with reference to FIGS. 5A to 5K, 6A to 6K and 7A to 7K. A semiconductor integrated circuit device is fabricated on a silicon substrate 1, and the integrated circuit includes a logic circuit, a static random access memory and an input and output circuit. The logic circuit, the static random access memory and the input and output circuit are assigned to a core region, a memory region and a peripheral region on the silicon substrate 1.

The logic circuit is implemented by complementary field effect transistors, i.e., a series combination of a p-channel type field effect transistor and an n-channel type field effect transistor, and the complementary field effect transistor has gate insulating layers of 2.0 nanometers thick. A component field effect transistor of the logic circuit is fabricated on an active area in the core region as shown in FIGS. 5A to 5K.

The static random access memory is implemented by logic gates, and field effect transistors form the static random access memory together with other circuit components such as, for example, resistors. The field effect transistor has a gate insulating layer of 2.5 nanometers thick, and is fabricated on an active area in the memory region as shown in FIGS. 6A to 6K.

The input and output circuit is a kind of the signal interface, and also includes field effect transistors. The field effect transistor has a gate insulating layer of 5.0 nanometers thick, and is fabricated on an active area in the peripheral region as shown in FIGS. 7A to 7K.

The process starts with preparation of the silicon substrate 1. A trench isolation 2 is selectively formed in a surface portion of the silicon substrate 1, and defines the active areas as shown in FIGS. 5A, 6A and 7A. Dopant impurity is ion implanted into the active areas for channel doping.

Subsequently, the silicon substrate 1 is thermally oxi-nitrized, and silicon oxynitride layers 41 are grown to 1.5 nanometers thick in the active areas. The oxi-nitrization is carried out under the following conditions. Process gas is introduced into the furnace chamber, and is nitrogen monoxide at 100 percent. The furnace chamber is maintained at 100 torr, and the oxi-nitrization is carried out at 1050 degrees in centigrade for 30 to 60 seconds. The nitrogen monoxide is decomposed to nitrogen and oxygen, and the nitrogen and oxygen react with the silicon. Relatively strong nitrization takes place in the active areas, and the active areas are covered with the silicon oxynitride layers 41 as shown in FIGS. 5B, 6B and 7B.

Subsequently, a photo-resist etching mask 31 is patterned on the silicon substrate 1 through the photo-lithography. Although the silicon oxynitride layer 41 in the core region is covered with the photo-resist etching mask 31, the other silicon oxynitride layers 41 are still exposed to the active areas in the memory/peripheral regions as shown in FIGS. 5C, 6C and 7C.

Figures 5D, 6D, 7D:
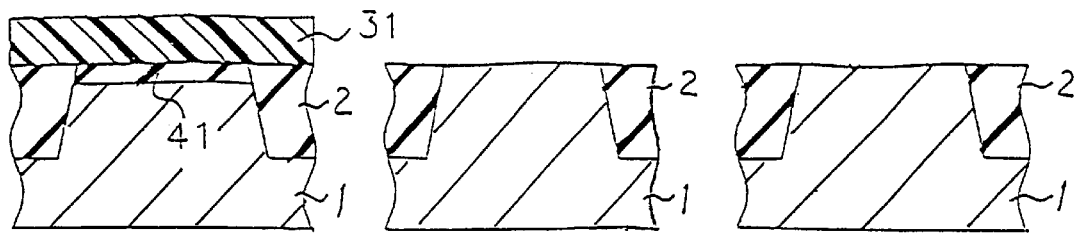
Figures 5E, 6E, 7E:
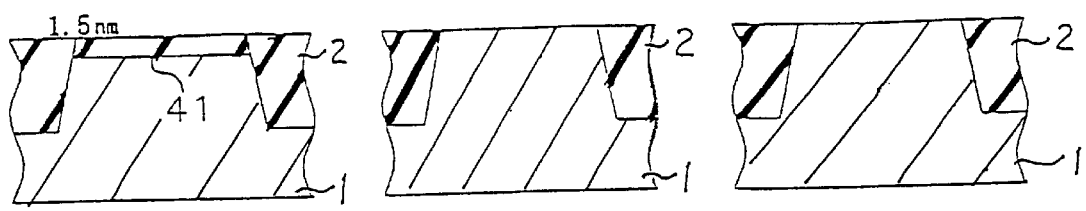

Subsequently, the silicon oxynitride layers 41 are etched away from the active areas in the memory/peripheral regions as shown in FIGS. 5D, 6D and 7D, and, thereafter, the photo-resist etching mask 31 is stripped off. Then, the silicon oxynitride layer 41 of 1.5 nanometers thick is exposed to the active area in the core region, and silicon substrate 1 is exposed to the active areas in the memory/peripheral regions. The resultant structure is shown in FIGS. 5E, 6E and 7E.

Figures 5F, 6F, 7F:
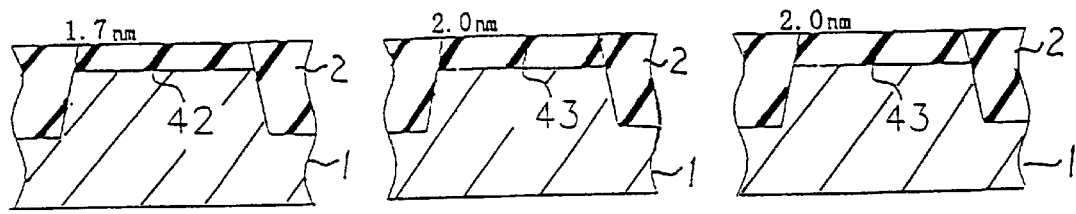

Subsequently, the resultant structure is oxi-nitrized under the following conditions. Gaseous mixture is supplied to the furnace chamber, and contains nitrogen monoxide at 50 percent and oxygen at 50 percent. The furnace chamber is regulated to 100 torr, and is maintained at 1000 degrees in centigrade. The nitrogen and the oxygen react with the silicon in the active areas in the memory/peripheral regions. The nitrogen and the oxygen are diffused through the silicon oxynitride layer 41 in the core region, and reach the boundary between the silicon substrate 1 and the silicon oxynitride layer 41. The reaction between the silicon and oxygen/nitrogen takes place at the boundary. However, the nitrogen decelerates the diffusion of oxidant, i.e., oxygen. Thus, the nitrogen serves as a diffusion inhibitor. The silicon substrate 1 is thermally oxi-nitrized for 30 to 60 seconds, and the nitrization is relatively weak rather than the first oxi-nitrization. The growth rate in the core region is relatively low, and the growth rate in the memory/peripheral regions is relatively high. The oxi-nitrization under the above-described conditions results in a silicon oxynitride layer 42 of 1.7 nanometers thick and silicon oxynitride layers 43 of 2.0 nanometers thick as shown in FIGS. 5F, 6F and 7F. Thus, the silicon oxynitride in the core region is only increased by 0.2 nanometer, which is 10 percent of the silicon oxynitride layers 43 grown through the oxi-nitrization.

Figures 5G, 6G, 7G:
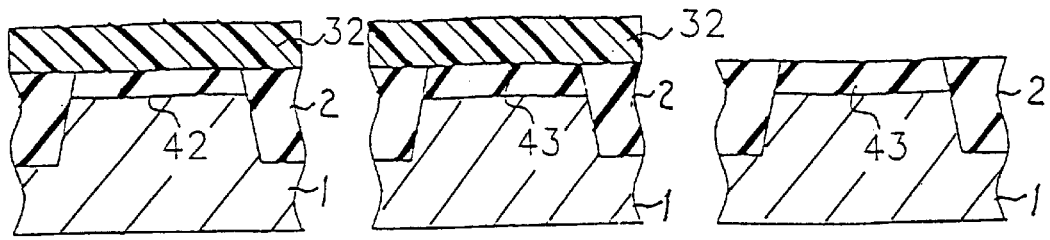
Figures 5H, 6H, 7H:
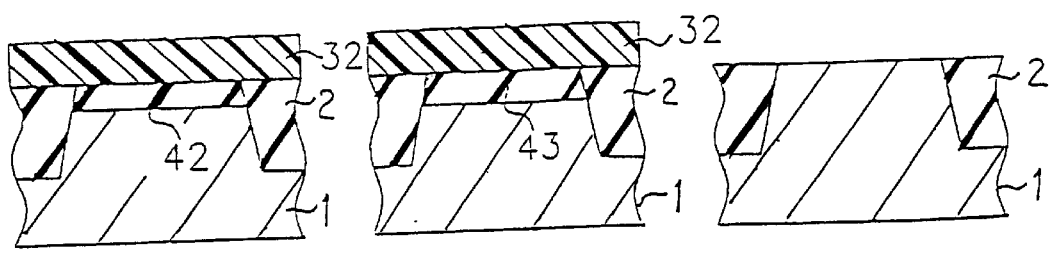

Subsequently, a photo-resist etching mask 32 is patterned on the resultant structure through the photo-lithography, and the silicon oxynitride layers 42/43 in the core/memory regions are covered with the photo-resist etching mask 32. The remaining silicon oxynitride layer 43 is exposed to the active area in the peripheral region as shown in FIGS. 5G, 6G and 7G. The remaining silicon oxynitride layer 43 is etched away from the active area in the peripheral region, and the silicon substrate 1 is exposed to the active area, only, as shown in FIGS. 5H, 6H and 7H.

The photo-resist etching mask 32 is tripped off, and the silicon oxynitride layers 42/43 and the silicon substrate 1 are exposed to the active areas as shown in FIGS. 5I, 6I and 7I.

Subsequently, the resultant structure is placed in the furnace chamber, and the silicon substrate 1 is thermally oxidized in oxygen ($O_2$) at 100 percent at 850 degrees in centigrade for 15 minutes. The silicon oxynitride layer 42 was grown through the relatively strong nitrization and the relatively weak nitrization, and the nitrogen content is relatively large. On the other hand, the silicon oxynitride layer 43 was grown only through the weak nitrization, and the nitrogen content is relatively small. In other words, the amount of inhibitor in the silicon oxynitride 42 is more than that in the silicon oxynitride 43. After both oxi-nitrizing steps, the growth rate of silicon oxide in the core region is smaller than that in the memory region. In other words, the oxygen is strongly decelerated in the silicon oxynitride layer 42, and the deceleration in the silicon oxynitride layer 43 is weaker than that in the silicon oxynitride layer 42. For this reason, while a silicon oxide layer is growing in the peripheral region through the oxidization, the silicon oxide is grown at the boundary between the silicon substrate 1 and the silicon oxynitride layer 42 by 0.3 nanometer thick and at the boundary between the silicon substrate 1 and the silicon oxynitride layer 43 by 0.5 nanometer thick. Upon completion of the oxidization, the active area in the core region is covered with the two-layered gate insulating layer 51 of 2.0 nanometers thick consisting of the silicon oxynitride layer 42 and the silicon oxide layer, the active area in the memory region is covered with the two-layered gate insulating layer 52 of 2.5 nanometers thick consisting of the silicon oxynitride layer 43 and the silicon oxide layer, and the active area in the peripheral region is covered with the gate insulating layer 61 of 5.0 nanometers thick as shown in FIGS. 5J, 6J and 7J.

Figure 5K:
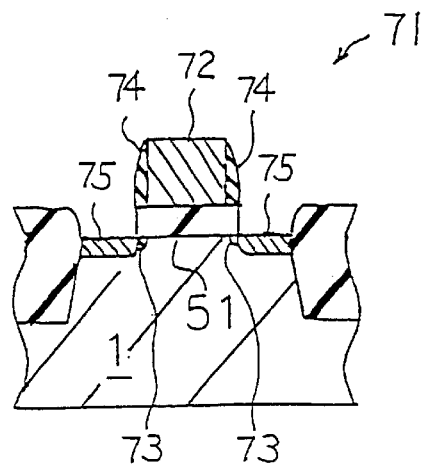
Figure 6K:
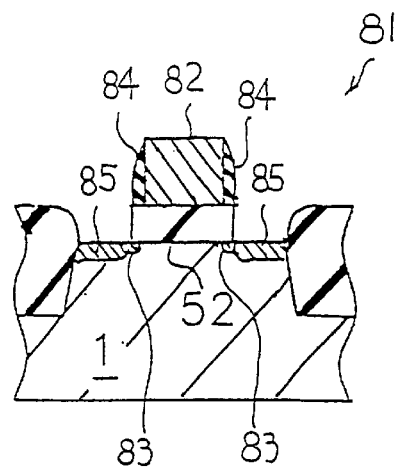
Figure 7K:
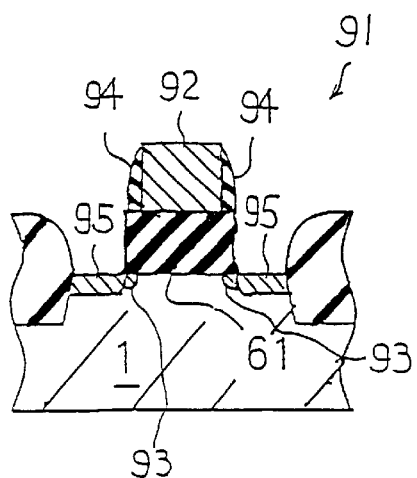

Subsequently, field effect transistors 71/81/91 are completed on the active areas in the core/memory/peripheral regions, respectively, as shown in FIGS. 5K, 6K and 7K. In detail, conductive material is deposited over the entire surface of the resultant structure, and a photo-resist etching mask (not shown) is patterned on the conductive layer. The conductive layer is selectively etched so as to form gate electrodes 72/82/92 on the gate insulating layers 51/52/61, respectively. Dopant impurity is ion implanted into the active areas, and forms lightly-doped source/drain regions 75/85/95 in the active areas. Insulating material is deposited over the entire surface of the resultant structure, and the insulating material layer is anisotropically etched away without any photo-resist etching mask. Side wall spacers 74/84/94 are left on the side surfaces of the gate electrodes 72/82/92. Dopant impurity is ion implanted into the active areas so as to form heavily-doped source/drain regions 75/85/95. When the dopant impurity is ion implanted into the silicon substrate 1, the silicon oxynitride layer prevents the channel regions from the ion-implanted impurity, and the channel regions keeps the impurity concentration at the channel doping.

The above-described treatments may concurrently proceed for the field effect transistors 71/81/91. Otherwise, the field effect transistors 71/81/91 may be sequentially completed through different steps.

The field effect transistor 71 forms a part of the complementary field effect transistor, and the complementary field effect transistor is incorporated in the logic circuit such as, for example, a data processor. The field effect transistor 81 is incorporated in a logic gate, which in turn is incorporated in the static random access memory. The field effect transistor 91 is incorporated in the input and output circuit. The logic circuit, the static random access memory and the input and output circuit form parts of the integrated circuit.

The field effect transistor 71 has the thinnest gate insulating layer 51, and achieves the switching speed fastest of all. Although the field effect transistor 81 is slower in switching action than the field effect transistor 71, the amount of leakage current through the gate insulating layer 52 is less than that flowing through the gate insulating layer 51. The field effect transistor 91 is applied with the power voltage supplied with the outside of the semiconductor integrated circuit device, and the thick gate insulating layer 61 is thick enough to withstand the power voltage. The field effect transistors 71/81 are applied with an internal power voltage lower than the power voltage supplied form the outside of the semiconductor integrated circuit device.

As will be understood from the foregoing description, the oxynitride layers 42/43 different in nitrogen content are formed before the oxidation. The nitrogen serves as a diffusion inhibitor during the oxidation, and the insulating layers 51/52/61 different in thickness are grown on the semiconductor substrate 1. The difference in thickness is of the order of several angstroms.

Second Embodiment

Another process embodying the present invention is described with reference to FIGS. 8A to 8J, 9A to 9J and 10A to 10J. An integrated circuit is fabricated on a silicon substrate 1 through the process sequence. A logic circuit, a static random access memory and an input and output circuit form parts of the integrated circuit. A core region, a memory region and a peripheral region are assigned to the logic circuit, the static random access memory and the input and output circuit, respectively. The logic circuit includes complementary field effect transistors, and gate insulating layers thereof are 2.0 nanometers thick. The static random access memory includes field effect transistors, gate insulating layers of which are 2.5 nanometers thick. The input and output circuit also includes field effect transistors, and the gate insulating layers of these component transistors are 5.0 nanometers thick. FIGS. 8A to 8J show a cross section in the core region where the field effect transistor of the complementary field effect transistor is to be fabricated. FIGS. 9A to 9J show a cross section in the memory region where the field effect transistor of the static random access memory is to be fabricated. FIGS. 10A to 10J show a cross section where the field effect transistor of the input and output circuit is to be fabricated.

The process starts with preparation of the silicon substrate 1. A trench isolating region 2 is formed in a surface portion of the silicon substrate 1, and defines active areas in the core/memory/peripheral regions as shown in FIGS. 8A, 9A and 10A. Channel doping is carried out for the field effect transistors.

Subsequently, the silicon substrate 1 is placed into a furnace chamber of an oxidation/oxi-nitrization system (not shown), and is thermally oxidized in oxygen ($O_2$) at 100 percent at 800 degrees in centigrade for 30 minutes. Silicon oxide is grown to 4.5 nanometers thick, and forms silicon oxide layers 62 in the active areas as shown in FIGS. 8B, 9B and 10B.

A photo-resist etching mask 33 is patterned on the resultant structure through the photo-lithography, and only the silicon oxide layer 62 in the peripheral region is covered with the photo-resist etching mask 33 as shown in FIGS. 8C, 9C and 10C.

The silicon oxide layers 62 are etched away from the active areas in the core/memory regions, and only the silicon oxide layer 62 is left in the active area in the peripheral region as shown in FIGS. 8D, 9D and 10D. The photo-resist etching mask 33 is stripped off, and the silicon substrate 1 is exposed to the active areas in the core/memory regions as shown in FIGS. 8E, 9E and 10E.

The resultant structure is placed in the furnace chamber, and the silicon substrate 1 is thermally oxi-nitrized in nitrogen monoxide (NO) at 100 percent at 1050 degrees in centigrade at 100 torr for 10 seconds to 30 seconds. The strong nitrization takes place. Silicon oxynitride layers 44 are grown to 1.6 nanometers thick in the active regions in the corel memory regions (see FIGS. 8F and 9F). However, the silicon oxynitride is grown by only 0.3 nanometers thick at the boundary between the silicon substrate 1 and the silicon oxide layer 62 (FIG. 10F). The active area in the peripheral region is covered with two-layered insulating layer 53 consisting of the silicon oxide layer 62 of 4.5 nanometers thick and the silicon oxynitride layer of 0.3 nanometer thick.

A photo-resist etching mask 34 is patterned on the resultant structure through the photo-lithography, and the silicon oxynitride layer 44 in the core region and the two-layered insulating layer 53 are covered with the photo-resist etching mask 34 as shown in FIGS. 8G and 10G. However, the silicon oxynitride layer 44 in the memory region is exposed to the active area (see FIG. 9G).

The silicon oxynitride layer 44 is etched away from the active area in the memory region (see FIG. 9H). The photo-resist etching mask 34 prevents the silicon oxynitride layer 44 in the core region and the two-layered insulating layer 53 from the etchant, and are left in the active areas in the core/peripheral regions (see FIGS. 8H and 10H).

Figures 8I, 9I, 10I:
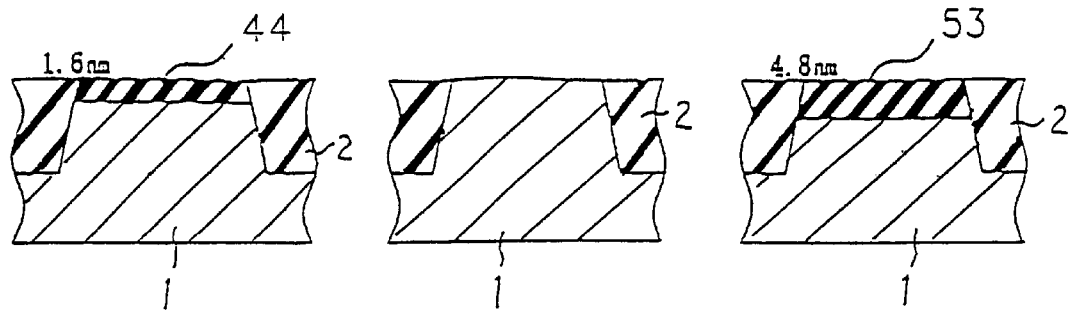
Figures 8J, 9J, 10J:
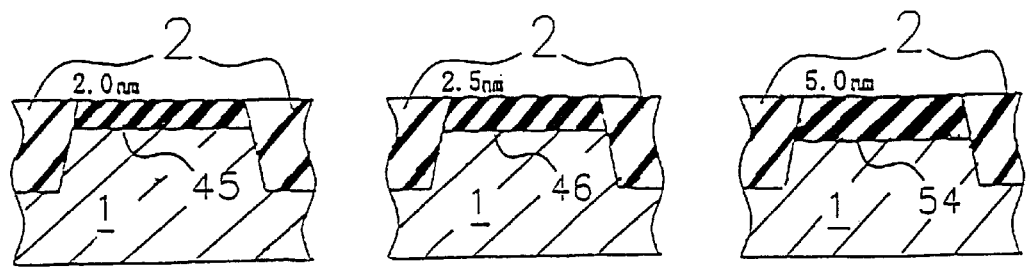

The photo-resist etching mask 34 is stripped off as shown in FIGS. 8I, 9I and 10I. The silicon substrate 1 is thermally oxi-nitrized in gaseous mixture containing nitrogen monoxide (NO) of 30 percent and oxygen ($O_2$) of 70 percent at 1000 degrees in centigrade at 100 torr for 200 seconds to 300 seconds. The weak nitrization takes place at the boundary between the silicon substrate 1 and the silicon oxynitride layer/two-layered insulating layer 44/53. The nitrogen serves as the diffusion inhibitor in the silicon oxynitride layer/two-layered insulating layer 44/53, and restricts the growth of silicon oxynitride. The silicon oxynitride is grown at the boundary between the silicon substrate 1 and the silicon oxynitride layer 44 by 0.4 nanometer thick, and the active area in the core region is covered with a gate insulating layer 45 of 2.0 nanometers thick as shown in FIG. 8J. The silicon oxynitride is grown to 2.5 nanometers thick on the silicon substrate 1, and the active area in the memory region is covered with a gate insulating layer 46 of 2.5 nanometers thick as shown in FIG. 9J. The silicon oxynitride is grown at the boundary between the silicon substrate 1 and the two-layered insulating layer 53 by 0.2 nanometer thick, and the active area in the peripheral region is covered with a gate insulating layer of 5.0 nanometers thick as shown in FIG. 10J.

Finally, the field effect transistors are completed as similar to those of the first embodiment.

As will be understood from the foregoing description, the silicon oxynitride layer 44 heavily containing the nitrogen is grown on the silicon substrate 44 before the growth of the silicon oxynitride layer 46 lightly containing the nitrogen. While the silicon oxynitride layer 46 is thermally growing on the silicon substrate 1 at high growth rate, the silicon oxynitride layer is slightly increased in thickness, and passes the silicon oxynitride layer 44 in the growth. This results in that the process achieves different in thickness of the order of several angstroms.

The field effect transistors fabricated through the process according to the present invention achieve high switching speed without sacrifice of the leak current. The silicon oxynitride is dense and small in stress so that the current is hardly leaked therethrough. The thinner the gate insulating layer, the higher the switching speed. The thin gate insulating layers such as 51/45 are formed of silicon oxynitride.

This results in that the field effect transistors achieves a high switching speed without sacrifice of the leakage current. Moreover, the silicon oxynitride layers prevent the channel regions from the dopant impurity, and the dopant impurity concentration is less varied in the channel regions.

Although particular embodiments of the present invention have been shown and described, it will be apparent to those skilled in the art that various changes and modifications may be made without departing from the spirit and scope of the present invention.

The oxi-nitrization and the oxidation may be arranged in an order different from those of the embodiments.

The process is applicable to any semiconductor device is so far as the manufacturer requires insulating layers different in thickness less than 1 nanometer. If the nitrogen content, furnace temperature, pressure and time period are appropriately controlled, the process according to the present invention achieves the difference in thickness of 1 angstrom or less.

The nitrogen and the oxygen may be supplied from another kind of gas. In other words, the source gas is never limited to the nitrogen monoxide.

Although three kinds of field effect transistors are fabricated through the process according to the present invention, two kinds of field effect transistors or more than three kinds of field effect transistors may be fabricated on a semiconductor substrate.

The insulating layers different in thickness may form parts of circuit components such as, for example, the dielectric layers of capacitors. Thus, the present invention is never limited to the field effect transistors.

What is claimed is:

1. A process for fabricating a semiconductor device, comprising the steps of:
   a) preparing a substrate formed of semiconductor material and having plural portions selectively assigned to plural circuit components of an integrated circuit;
   b) growing a first insulating layer formed of a first kind of insulating material containing an oxidizing agent diffused therethrough and reactive with said semiconductor material and a diffusion inhibitor against the diffusion of said oxidizing agent on one of said plural portions of said substrate, a first amount of said diffusion inhibitor being at a first ratio to a first amount of said oxidizing agent;
   c) growing a second insulating layer formed of a second kind of insulating material containing said oxidizing agent and said diffusion inhibitor on another portion of said substrate so as to form a first dielectric layer having at least said first insulating layer and a second dielectric layer different in thickness from said first dielectric layer and having at least said second insulating layer for one of said plural circuit components and another of said plural circuit components, respectively, a second amount of said diffusion inhibitor in said second insulating layer being at a second ratio to a second amount of said oxidizing agent in said second insulating layer; and
   d) forming a gate electrode on each of said first dielectric layer and said second dielectric layer.

2. The process as set forth in claim 1, in which said semiconductor material, said oxidizing agent and said diffusion inhibitor are silicon, oxygen and nitrogen, respectively.

3. A process for fabricating a semiconductor device, comprising the steps of:
   a) preparing a substrate formed of semiconductor material and having plural portions selectively assigned to plural circuit components of an integrated circuit;

b) growing a first insulating layer formed of a first kind of insulating material containing an oxidizing agent diffused therethrough and reactive with said semiconductor material and a diffusion inhibitor against the diffusion of said oxidizing agent on one of said plural portions of said substrate;

c) growing a second insulating layer formed of a second kind of insulating material containing said oxidizing agent on said one of said plural portions and another portion of said substrate so as to form a first dielectric layer having at least said first and second insulating layers and a second dielectric layer different in thickness from said first dielectric layer and having said second insulating layer for one of said plural circuit components and another of said plural circuit components, respectively; and d) forming a gate electrode on each of said first dielectric layer and said second dielectric layer; and further comprising the step of e) growing third insulating layers formed of a third kind of insulating material containing said oxidizing agent and said diffusion inhibitor different in ratio from that of said first kind of insulating material on said one of said plural portions and yet another portion of said substrate between said step b) and said step c) so that said first dielectric layer further has said third insulating layer, and said yet another portion is covered with a third dielectric layer different in thickness from said first and second dielectric layers and having said second and third insulating layers in said step c).

4. The process as set forth in claim 3, in which said second dielectric layer is the thickest of the three, and said first dielectric layer is thinner than said third dielectric layer.

5. The process as set forth in claim 3, said step b) includes the sub-steps of b-1) exposing said one of said plural portions, said another of said plural portions and said yet another portion to a kind of source gas containing said oxidizing agent and said diffusion inhibitor for growing the first insulating layers thereon, b-2) forming an etching mask on the resultant structure of said sub-step b-1) so as to cover said first insulating layer in said one of said plural portions therewith, b-3) etching the first insulating layers from said another of said plural portions and said yet another portion, and b-4) removing said etching mask from the resultant structure of said step b-3).

6. The process as set forth in claim 3, said step e) includes the sub-steps of e-1) exposing said one of said plural portions, said another of said plural portions and said yet another portion to a first kind of source gas containing said oxidizing agent and said diffusion inhibitor less in ratio than a second kind of source gas used in said step b) for growing the third insulating layers thereon, e-2) forming an etching mask on the resultant structure of said sub-step e-1) so as to cover the third insulating layers in said one of said plural portions and said yet another portion therewith, e-3) etching the third insulating layers from said another of said plural portions, and e-4) removing said etching mask from the resultant structure.

7. The process as set forth in claim 6, in which said oxidizing agent and said diffusion inhibitor in said first and second kinds of source gas are oxygen and nitrogen, respectively, and said semiconductor material is silicon.

8. A process for fabricating a semiconductor device, comprising the steps of:

a) preparing a substrate formed of semiconductor material and having plural portions selectively assigned to plural circuit components of an integrated circuit;

b) growing a first insulating layer formed of a first kind of insulating material containing an oxidizing agent diffused therethrough and reactive with said semiconductor material and a diffusion inhibitor against the diffusion of said oxidizing agent on one of said plural portions of said substrate;

c) growing a second insulating layer formed of a second kind of insulating material containing said oxidizing agent on said one of said plural portions and another portion of said substrate so as to form a first dielectric layer having at least said first and second insulating layers and a second dielectric layer different in thickness from said first dielectric layer and having said second insulating layer for one of said plural circuit components and another of said plural circuit components, respectively; and d) forming a gate electrode on each of said first dielectric layer and said second dielectric layer; and further comprising the step of e) growing third insulating layers formed of a third kind of insulating material containing said oxidizing agent and said diffusion inhibitor smaller in ratio than said first kind of insulating material on said one of said plural portions and yet another portion of said substrate between said step b) and said step c).

9. The process as set forth in claim 8, in which a first dielectric layer, a second dielectric layer and a third dielectric layer respectively have said first, second and third insulating layers, said second insulating layer and said second and third insulating layers in said step c), and said second dielectric layer is thicker than said third dielectric layer and thinner than said first dielectric layer.

10. The process as set forth in claim 8, in which said step b) includes the sub-steps of e-1) exposing said one of said plural portions, said another of said plural portions and said yet another portion to a kind of source gas containing said oxidizing agent and said diffusion inhibitor for growing the first insulating layers thereon, b-2) forming an etching mask on the resultant structure of said sub-step b-1) so as to cover the first insulating layer in said one of said plural portions therewith, b-3) removing the first insulating layers from said another of said plural portions and said yet another portion, and b-4) removing said etching mask.

11. The process as set forth in claim 8, said step e) includes the sub-steps of e-1) exposing said one of said plural portions, said another of said plural portions and said yet another portion to a first kind of source gas containing said oxidizing agent and said diffusion inhibitor smaller in ratio than a second kind of source gas used in said step b) so as to grow the third insulating layers thereon, e-2) forming an etching mask on the resultant structure of said sub-step e-1) so as to cover said third insulating layers in said one of said plural portions and said yet another portion therewith, e-3) removing the third insulating layer from said another of said plural portions, and e-4) removing said etching mask.

* * * * *